US012799586B2

(12) United States Patent
She et al.

(10) Patent No.: US 12,799,586 B2
(45) Date of Patent: Nov. 17, 2026

(54) COATINGS FOR TOOLING

(71) Applicant: RTX Corporation, Farmington, CT (US)

(72) Inventors: Ying She, Rocky Hill, CT (US); Andrew Joseph Lazur, La Jolla, CA (US); Mary Colby, West Hartford, CT (US)

(73) Assignee: RTX Corporation, Farmington, CT (US)

( * ) Notice: Subject to any disclaimer, the term of this patent is extended or adjusted under 35 U.S.C. 154(b) by 31 days.

(21) Appl. No.: 18/436,625

(22) Filed: Feb. 8, 2024

(65) Prior Publication Data

US 2024/0271275 A1 Aug. 15, 2024

Related U.S. Application Data

(60) Provisional application No. 63/444,654, filed on Feb. 10, 2023.

(51) Int. Cl.

*C23C 16/44* (2006.01)
*C04B 35/80* (2006.01)
*C04B 41/45* (2006.01)
*C23C 16/04* (2006.01)

(52) U.S. Cl.

CPC .......... *C23C 16/4404* (2013.01); *C04B 35/80* (2013.01); *C04B 41/4531* (2013.01); *C23C 16/045* (2013.01); *C04B 2235/5252* (2013.01)

(58) Field of Classification Search

None

See application file for complete search history.

(56) References Cited

U.S. PATENT DOCUMENTS

| | | | | |
|---|---|---|---|---|
| 5,080,547 | A | 1/1992 | Moghe | |
| 5,163,498 | A | 11/1992 | Kantner et al. | |
| 5,225,015 | A | 7/1993 | Allaire et al. | |
| 6,413,321 | B1 | 7/2002 | Kim et al. | |
| 6,696,144 | B2 | 2/2004 | Holowczak et al. | |
| 2013/0302616 | A1 | 11/2013 | Kano | |
| 2016/0326644 | A1* | 11/2016 | Gopi | H01J 37/3244 |
| 2023/0242451 | A1* | 8/2023 | Gray | C04B 35/573 501/99 |

FOREIGN PATENT DOCUMENTS

| | | | |
|---|---|---|---|
| EP | 1815975 | A1 | 8/2007 |
| EP | 3805424 | A1 | 4/2021 |

OTHER PUBLICATIONS

Sun et al., A review on the preparation and application of BN composite coatings, Ceramics International, vol. 49, Issue 1, Jan. 2023, pp. 24-39. (Year: 2023).*
Extended European Search Report for EP Application No. 24156944.1, dated Jul. 12, 2024, 5 pages.

* cited by examiner

*Primary Examiner* — Elizabeth Collister
(74) *Attorney, Agent, or Firm* — Kinney & Lange, P.A.

(57) ABSTRACT

A tooling fixture is disclosed for densification by chemical vapor infiltration of a fiber preform of a ceramic matrix composite. The tooling fixture includes a body having oppositely disposed first and second surfaces and a plurality of holes extending between the first and second surfaces, and a coating. The first surface is configured to be disposed adjacent to the fiber preform. The coating is disposed on the first surface and surfaces defining the plurality of holes. The coating comprises at least one of a ceramic material, hexagonal boron nitride, turbostratic boron nitride, and graphite.

9 Claims, 3 Drawing Sheets

COATINGS FOR TOOLING

CROSS-REFERENCE TO RELATED APPLICATION(S)

This application claims the benefit of U.S. Provisional Application No. 63/444,654 filed Feb. 10, 2023 for "COATINGS FOR TOOLING" by Y. She, A. J. Lazur, and M. Colby.

BACKGROUND

The present invention relates generally to the manufacture of ceramic matrix composite (CMC) parts and more particularly to tooling fixtures used in chemical vapor deposition/chemical vapor infiltration (CVD/CVI) processing.

CMC parts are widely fabricated by densifying preforms that are made from woven fabric tows. CVI is one of the most used densification techniques in industry. Perforated tooling is commonly used to hold the preforms during the initial densification cycle(s) to keep the preform in a rigid form and maintain proper shape and geometry. After the initial densification cycle(s), when the preform is rigid enough to stand alone in a subsequent densification process, detooling is performed to remove the preform from the tooling.

Delamination of the preform can occur during the detooling process if the preform sticks to the tooling. Delamination can damage the preform to the extent that the preform is unusable and the process must be restarted with a new fiber preform.

SUMMARY

In one aspect, a tooling fixture is disclosed for densification by chemical vapor infiltration of a fiber preform of a ceramic matrix composite. The tooling fixture includes a body having oppositely disposed first and second surfaces and a plurality of holes extending between the first and second surfaces, and a coating. The first surface is configured to be disposed adjacent to the fiber preform. The coating is disposed on the first surface and surfaces defining the plurality of holes. The coating comprises at least one of a ceramic material, hexagonal boron nitride, turbostratic boron nitride, and graphite.

In another aspect, a method of forming a ceramic matrix composite includes disposing a fiber preform in a tooling fixture, placing the tooling fixture with the fiber preform in a chemical vapor infiltration reactor, at least partially densifying the fiber preform with a ceramic matrix through a process of chemical vapor infiltration, and releasing the at least partially densified fiber preform from the tooling fixture. The tooling fixture includes a coating disposed on fiber preform-facing surfaces and surfaces defining holes through the tooling fixture. The coating includes at least one of a ceramic material, hexagonal boron nitride, turbostratic boron nitride, and graphite. The at last partially densified fiber preform is released without delamination of the partially densified fiber preform.

In yet another aspect, a method of forming a ceramic matrix composite includes disposing a fiber preform in a tooling fixture, placing the tooling fixture with the fiber preform in a chemical vapor infiltration reactor, at least partially densifying the fiber preform with a ceramic matrix through a process of chemical vapor infiltration, and releasing the at least partially densified fiber preform from the tooling fixture. The tooling includes a coating disposed on fiber preform-facing surfaces and surfaces defining holes through the tooling fixture. The coating comprises at least one of a ceramic material, hexagonal boron nitride, turbostratic boron nitride, and graphite. The at last partially densified fiber preform is released without delamination of the partially densified fiber preform.

The present summary is provided only by way of example, and not limitation. Other aspects of the present disclosure will be appreciated in view of the entirety of the present disclosure, including the entire text, claims and accompanying figures.

Figure 1:
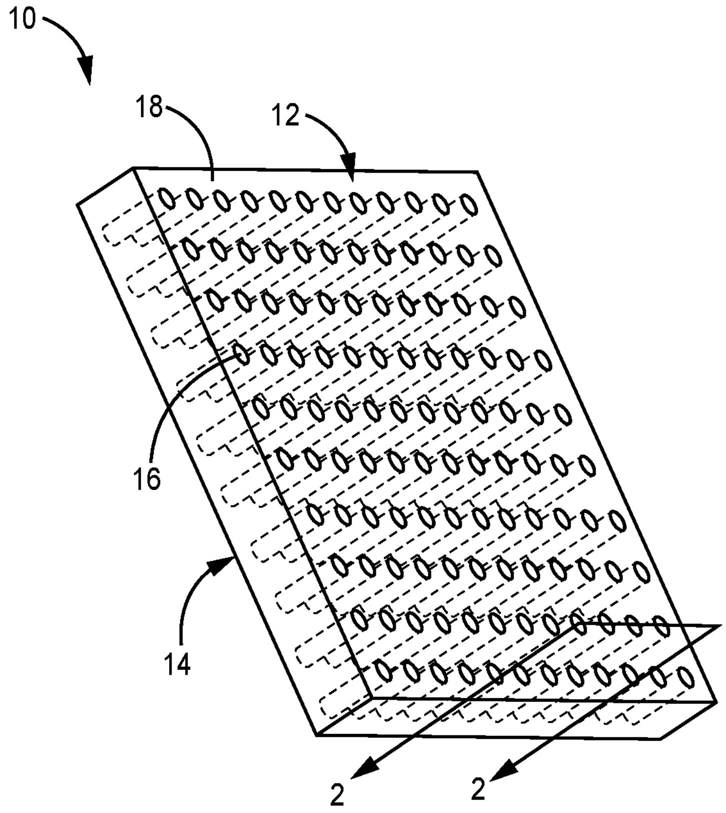
FIG. 1 is a simplified perspective view of a tooling fixture for CMC manufacture via chemical vapor deposition/chemical vapor infiltration.

While the above-identified figures set forth one or more embodiments of the present disclosure, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings.

DETAILED DESCRIPTION

The present disclosure is directed to various coatings that can be applied to a tooling fixture used in CVI processes for initial densification of preforms in the manufacture of CMC components. The disclosed coatings can be applied to surfaces of the tooling fixture to aid in release of the preform following an initial densification process and to prevent delamination of the preform. The disclosed coatings can additionally seal the tooling fixture to prevent residue from the tooling fixture from contaminating the preform during the CVI process.

FIG. 1 is a simplified perspective view of a perforated tooling fixture that can be used in a CVI densification process. Tooling fixture 10 includes inner surface 12, oppositely disposed outer surface 14, holes 16, and coating 18. Holes 16 extend through a thickness of tooling fixture 10 between inner surface 12 and outer surface 14. Holes 16 open to inner surface 12 and outer surface 14. Coating 18 can be disposed on inner surface 12, outer surface 14, and surfaces defining holes 16.

Tooling fixture 10 can be used in combination with one or more tooling fixtures as known in the art to at least partially enclose a preform to help maintain a shape of the preform during CVI processing. Tooling fixture 10 can have any shape or configuration depending on the geometry of the final CMC component. Inner surface 12 is a preform-facing surface. Holes 16 are configured to deliver a reactant gas to the preform during CVI. Tooling fixture 10 can be formed from graphite. The preform (not shown) can be formed from tows of fibers arranged in a three-dimensional (3D) weave or a single or plurality of stacked two-dimensional (2D) woven fiber plies as known in the art. The preform can be formed from non-woven (e.g., chopped, felted, etc.) fibers. Suitable fiber materials include, but are not limited to carbon, silicon carbide (SiC), alloyed and/or zirconium carbide, hafnium carbide, aluminum silicate, alumina, glass ceramic, and other materials suitable for high temperature operation.

Tooling fixture 10 includes coating 18 on inner surface 12 and surfaces defining holes 16. In some embodiments, coating 18 can be applied to all surfaces of tooling fixture 10 such that coating 18 fully encases tooling fixture 10. Coating 18 can function to aid in the release of the preform during a process of detooling or removing the preform from tooling fixture 10 once the preform has a rigidity sufficient to maintain a shape outside of tooling fixture 10 in subsequent CVI processing. Coating 18 can additionally function to seal tooling fixture 10 to prevent residue from tooling fixture 10 from contaminating the preform during the CVI process. Coating 18 can be any of a variety of coatings disclosed herein and discussed with respect to FIGS. 2-8.

Figure 2:
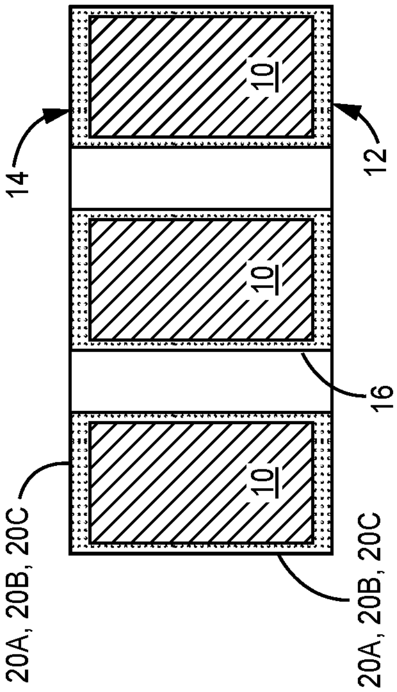
FIG. 2 is a simplified enlarged cross-sectional view of the tooling fixture of FIG. 1 having a coating.
Figure 3:
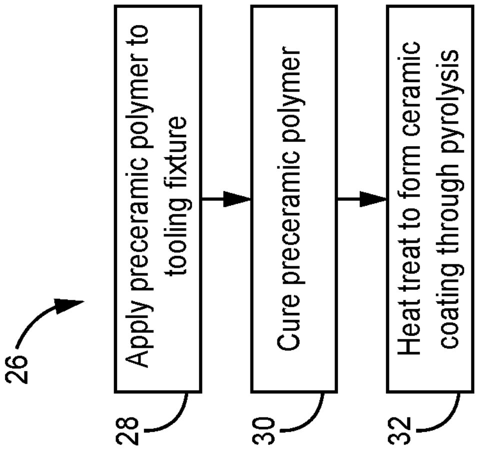
FIG. 3 is a flow chart of a method for forming one embodiment of the coating of FIG. 2.
Figure 4:
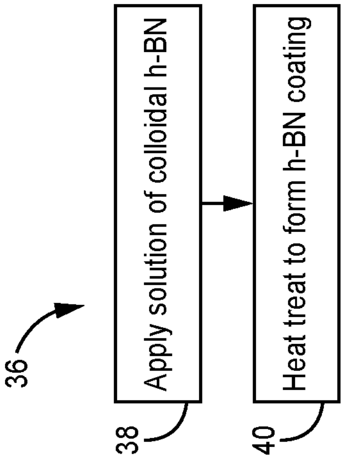
FIG. 4 is a flow chart of a method for forming another embodiment of the coating of FIG. 2.
Figure 5:
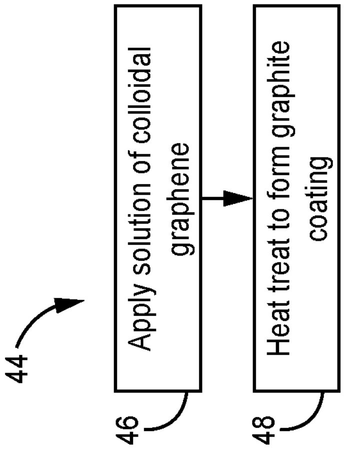
FIG. 5 is a flow chart of a method for forming yet another embodiment of the coating of FIG. 2.

FIG. 2 is a simplified enlarged cross-sectional view of tooling fixture 10 taken along the 2-2 line of FIG. 1 and having a coating according to one set of embodiments of the present disclosure. Tooling fixture 10, inner surface 12, outer surface 14, holes 16, and coating 20A, 20B, 20C are shown. Any one of coatings 20A, 20B, and 20C can be applied to tooling fixture 10. FIG. 3 is a flow chart of method 26 for forming coating 20A. FIG. 4 is a flow chart of method 36 for forming coating 20B. FIG. 5 is a flow chart of method 44 for forming coating 20C. FIGS. 2-5 are discussed together herein.

In one embodiment, tooling fixture 10 can be coated with coating 20A. Coating 20A is a ceramic material. Coating 20A can be, for example, SiC or silicon nitride ($Si_3N_4$). Coating 20A can be a polymer derived ceramic formed according to method 26. Coating 20A, can be formed, for example, from polymeric materials, and specifically, a preceramic polymer. The preceramic polymer can be, for example, a polycarbosilane such as polydimethylsilane. The preceramic polymer can be provided in a liquid phase, which can be applied to tooling fixture 10 in step 28 by one of a variety of methods, including but not limited to brushing/painting, or spraying to provide tooling fixture 10 with a preceramic polymer intermediate coating layer. Ceramic coatings formed of preceramic polymers according to method 26 can have a porous microstructure as compared to dense ceramic coatings formed via CVI.

The preceramic polymer intermediate coating layer can be cured on tooling fixture 10 in step 30 to produce a cured coating layer. Curing can include heat treatment in air or in an inert atmosphere. Curing can be conducted, for example, at a temperature of approximately 190° C. for less than approximately 30 minutes. Curing time can vary depending on a thickness of the intermediate preceramic polymer coating layer applied to tooling fixture 10 in step 28.

The cured coating layer can undergo a second heat treatment and pyrolysis in step 32 to form ceramic coating 20A. Pyrolysis can be conducted, for example, in a CVI reactor at a temperature ranging from about 1100° C. to 1300° C. Step 32 can be performed under vacuum or in a desired atmosphere (i.e., inert or reactive atmosphere). Step 32 can generally be conducted in less than 30 minutes.

In one embodiment, coating 20A can be SiC. SiC can be formed using method 26 starting with the preceramic polymer polydimethylsilane and pyrolysis in an inert (nitrogen) atmosphere. In another embodiment, coating 20A can be $Si_3N_4$. $Si_3N_4$ can be formed using method 26 starting with the preceramic polymer polydimethylsilane and with the addition of ammonia gas during pyrolysis (step 32). Coating 20A can be other ceramic materials formed using method 26 and is not limited to SiC and $Si_3N_4$.

In another embodiment, tooling fixture 10 can be coated with coating 20B. Coating 20B can be hexagonal boron nitride (h-BN) formed according to method 36 shown in FIG. 4. Hexagonal boron nitride has a layered structure with layers held together by weak van der Waals forces, which can aid in the release of the preform from tooling fixture 10. Additionally, hexagonal boron nitride is chemically inert under CVI process conditions. In other embodiments, tooling fixture 10 can be coated with turbostratic boron nitride.

A colloidal solution of h-BN can be applied in step 38 to form an intermediate colloidal solution coating layer on tooling fixture 10. The intermediate colloidal solution of h-BN can be applied using any of a variety of methods including, but not limited to, brushing/painting or spraying. The colloidal solution of h-BN can be prepared using a known exfoliation and dispersion process, forming an h-BN flake colloidal solution comprising h-BN flakes of approximately 2.5 nm thick and 100-200 nm in lateral size. Concentrations of h-BN can range from, for example, 0.3 to 30 mg/ml.

The colloidal h-BN solution coating layer can be dried on tooling fixture 10 and can be heat treated in step 40. Heat treating removes volatile organic compounds from the colloidal h-BN solution coating layer, providing an h-BN coating on tooling fixture 10.

In alternative embodiments, coating 20B can be h-BN or turbostratic BN formed on tooling fixture 10 via a CVD process.

In yet another embodiment, tooling fixture 10 can be coated with coating 20C. Coating 20C can be graphite formed according to method 44 shown in FIG. 5. Like hexagonal boron nitride, graphite has a layered structure with weak strength between layers and is chemically inert under CVI process conditions.

A colloidal solution of graphene can be applied in step 46 to form an intermediate colloidal solution coating layer on tooling fixture 10. The intermediate colloidal solution of graphene can be applied using any of a variety of methods including, but not limited to, brushing/painting or spraying. Colloidal dispersions of graphene can be prepared using known methods of ball milling multi-layered graphene sheets in organic solvent. For example, graphite (multi-layered graphene sheets) having a starting thickness of 30 to 80 nm and lateral size of around 5 to 20 μm can be ball milled in an organic solvent such as dimethylformamide (MMF) to form graphite flakes having a thickness of around 0.5 nm and lateral size of around 100 to 200 nm.

The colloidal solution coating layer can be dried on tooling fixture 10 and can be heat treated in step 48. Heat treating removes volatile organic compounds from the colloidal graphene solution coating layer, providing a graphite coating on tooling fixture 10.

A thickness of coating 20A, 20B, 20C can range from approximately 20 nm to 2000 nm. A coating thickness of 2000 nm does not effectively change the hole size in tooling fixture 10 (e.g., much less than 1% reduction of hole size).

Figure 6:
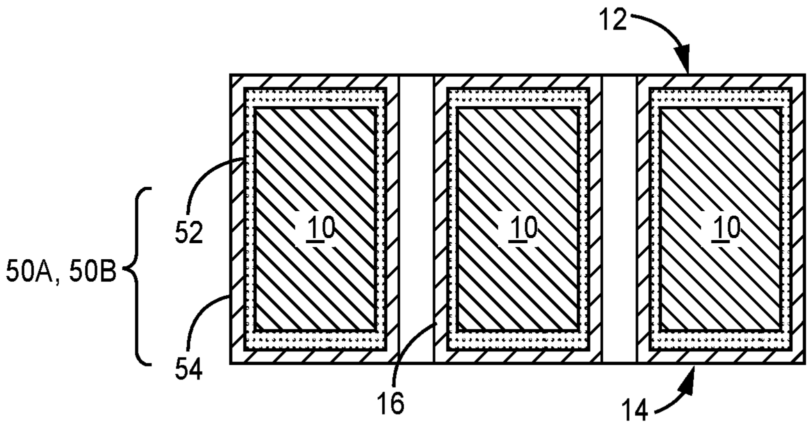
FIG. 6 is a simplified enlarged cross-sectional view of the tooling fixture of FIG. 1 having a multi-layer coating.
Figure 7:
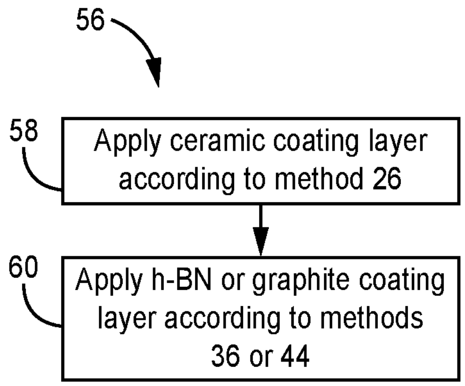
FIG. 7 is a flow chart of a method for forming one embodiment of the multi-layer coating of FIG. 6
Figure 8:
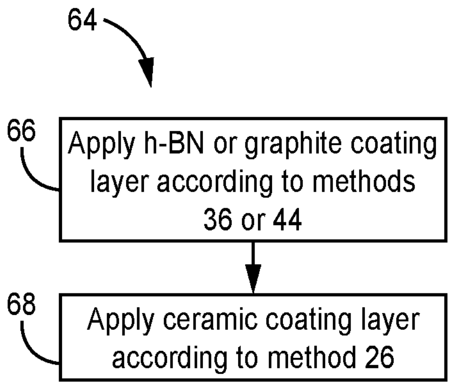
FIG. 8 is a flow chart of a method for forming another embodiment of the multi-layer coating of FIG. 6.

FIG. 6 is a simplified enlarged cross-sectional view of tooling fixture 10 of FIG. 1 having a multi-layer coating according to another set of embodiments of the present disclosure. Tooling fixture 10, inner surface 12, outer surface 14, holes 16, and coating 50A, 50B including inner coating layer 52 and outer coating layer 54 are shown. FIG. 7 is a flow chart of method 56 for forming coating 50A, 50B of FIG. 6. FIG. 8 is a flow chart of method 64 for forming coating 50A, 50B of FIG. 6. FIGS. 6-8 are discussed together herein.

Coating 50A, 50B includes inner coating layer 52 disposed on tooling fixture 10 and outer coating layer 54 disposed on inner coating layer 52. Outer coating layer 54 interfaces with the preform during CVI processing.

In one embodiment, tooling fixture 10 can be coated with coating 50A. Coating 50A includes inner coating layer 52 formed of a ceramic coating and outer coating layer 54 formed of h-BN or graphite. Inner coating layer 52 can be, for example, SiC, $Si_3N_4$, or other polymer-derived ceramic material as previously discussed.

Coating 50A can be formed according to method 56 shown in FIG. 7. In step 58, a ceramic coating can be formed on surfaces of tooling fixture 10 according to method 26 of FIG. 3, providing inner coating layer 52. Outer coating layer 54 can be provided, in step 60, following formation of the ceramic coating (inner coating layer 52). In step 60, a h-BN coating or a graphene coating can be applied to inner coating according to methods 36 and 44 of FIGS. 4 and 5, respectively.

A thickness of coating 50A can range from approximately 40 nm to 2000 nm. A thickness of inner coating layer 52 can range from approximately 20 nm to 1000 nm. A thickness of outer coating layer 54 can range from approximately 20 nm to 1000 nm.

In another embodiment, tooling fixture 10 can be coated with coating 50B. Coating 50B includes inner coating layer 52 formed of a h-BN coating or graphite coating and outer coating layer 54 formed of a ceramic material. Outer coating layer 54 can be, for example, SiC, $Si_3N_4$, or other polymer-derived ceramic material as previously discussed.

Coating 50B can be formed according to method 64 shown in FIG. 8. In step 66, a h-BN coating or a graphene coating can be applied to surfaces of tooling fixture 10 according to methods 36 and 44 of FIGS. 4 and 5, respectively. Outer coating layer 54 can be provided, in step 68, following formation of the h-BN or graphite coating (inner coating layer 52). In step 68, a ceramic coating can be applied to according to method 26 of FIG. 3 to form outer coating layer 54.

A thickness of coating 50B can range from approximately 40 nm to 2000 nm. A thickness of inner coating layer 52 can range from approximately 20 nm to 1000 nm. A thickness of outer coating layer 54 can range from approximately 20 nm to 1000 nm.

The disclosed coatings can be provided to a perforated tooling fixture used for CVD/CVI processes to aid in the release of a partially densified CMC preform and prevent delamination of the CMC preform during detooling. The disclosed coatings can also effectively seal the perforated tooling fixture and prevent residue from being released from the tooling fixture during CVD/CVI processing.

DISCUSSION OF POSSIBLE EMBODIMENTS

The following are non-exclusive descriptions of possible embodiments of the present invention.

A tooling fixture is disclosed for densification by chemical vapor infiltration of a fiber preform of a ceramic matrix composite. The tooling fixture includes a body having oppositely disposed first and second surfaces and a plurality of holes extending between the first and second surfaces and a coating disposed on the first surface and surfaces defining the plurality of holes. The first surface is configured to be disposed adjacent to the fiber preform. The coating includes at least one of a ceramic material, hexagonal boron nitride, turbostratic boron nitride, and graphite.

The tooling fixture of the preceding paragraph can optionally include, additionally and/or alternatively, any one or more of the following features, configurations and/or additional components:

In an embodiment of the tooling fixture of foregoing paragraph, the coating comprises silicon carbide or silicon nitride.

In a further embodiment of the tooling fixture of any of the foregoing paragraphs, the coating can comprise an inner layer formed of the ceramic material and an outer layer disposed on the inner layer, the outer layer formed of hexagonal boron nitride, turbostratic boron nitride, or graphite.

In a further embodiment of the tooling fixture of any of the foregoing paragraphs, the coating can comprise an inner layer formed of the hexagonal boron nitride, turbostratic boron nitride, or graphite and an outer layer disposed on the inner layer, the outer layer formed of the ceramic material.

In a further embodiment of the tooling fixture of any of the foregoing paragraphs, the coating can comprise a polymer derived ceramic.

In a further embodiment of the tooling fixture of any of the foregoing paragraphs, the coating can comprise hexagonal boron nitride.

In a further embodiment of the tooling fixture of any of the foregoing paragraphs, the coating can be disposed on the second surface.

A method of forming a ceramic matrix composite includes disposing a fiber preform in a tooling fixture, placing the tooling fixture with the fiber preform in a chemical vapor infiltration reactor, at least partially densifying the fiber preform with a ceramic matrix through a process of chemical vapor infiltration, and releasing the at least partially densified fiber preform from the tooling fixture. The tooling fixture includes a coating disposed on fiber preform-facing surfaces and surfaces defining holes through the tooling fixture. The coating includes at least one of a ceramic material, hexagonal boron nitride, turbostratic boron nitride, and graphite. The at last partially densified fiber preform is released without delamination of the partially densified fiber preform.

The method of the preceding paragraph can optionally include, additionally and/or alternatively, any one or more of the following features, configurations, additional components, and/or steps:

In a further embodiment of the foregoing method, heat-treating can include curing the first intermediate coating, the intermediate coating comprising a preceramic polymer, and converting the preceramic polymer to a ceramic material through pyrolysis.

In a further embodiment of the method of any of the foregoing paragraphs, the first intermediate coating can comprise a polycarbosilane.

In a further embodiment of the method of any of the foregoing paragraphs, pyrolysis can be conducted in the presence of ammonia.

An embodiment of the method of any of the foregoing methods can further include applying a second intermediate coating to a preform-facing surface of the tooling fixture, applying the second intermediate coating to surfaces defining holes of the tooling fixture, and heat-treating the second intermediate coating on the tooling fixture to form a second final coating. The second intermediate coating can include at least one of colloidal hexagonal boron nitride and colloidal graphene.

In a further embodiment of the method of any of the foregoing paragraphs, the first final coating can be formed on the second final coating.

In a further embodiment of the method of any of the foregoing paragraphs, the intermediate coating can be applied by brushing or spraying.

A method of forming a ceramic matrix composite includes disposing a fiber preform in a tooling fixture, placing the tooling fixture with the fiber preform in a chemical vapor infiltration reactor, at least partially densifying the fiber preform with a ceramic matrix through a process of chemical vapor infiltration, and releasing the at least partially densified fiber preform from the tooling fixture. The tooling includes a coating disposed on fiber preform-facing surfaces and surfaces defining holes through the tooling fixture. The coating comprises at least one of a ceramic material, hexagonal boron nitride, and graphite. The at last partially densified fiber preform is released without delamination of the partially densified fiber preform.

The method of the preceding paragraph can optionally include, additionally and/or alternatively, any one or more of the following features, configurations, additional components, and/or steps:

In a further embodiment of the foregoing method, the coating can comprise a first layer formed of the ceramic material and a second layer formed of the hexagon-boron nitride or graphite.

In a further embodiment of the method of any of the foregoing paragraphs, the first layer can be disposed on the second layer, the first layer disposed adjacent to the fiber preform.

In a further embodiment of the method of any of the foregoing paragraphs, the second layer can be disposed on the first layer, the second layer disposed adjacent to the fiber preform.

In a further embodiment of the method of any of the foregoing paragraphs, the coating can comprise silicon carbide.

In a further embodiment of the method of any of the foregoing paragraphs, the coating can comprise silicon nitride.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A tooling fixture for densification by chemical vapor infiltration of a fiber preform of a ceramic matrix composite, the tooling fixture comprising:

a body having oppositely disposed first and second surfaces and a plurality of holes extending between the first and second surfaces, the first surface configured to be disposed adjacent to the fiber preform;

a coating disposed on the first surface and surfaces defining the plurality of holes, the coating comprising an inner layer and an outer layer disposed on the inner layer, wherein one of the inner layer and the outer layer is a ceramic material and the other of the inner layer and the outer layer consists of hexagonal boron nitride, turbostratic boron nitride, or graphite.

2. The tooling fixture of claim 1, wherein the ceramic material is comprises silicon carbide or silicon nitride.

3. The tooling fixture of claim 1, wherein the inner layer is the ceramic material and the outer layer consists of hexagonal boron nitride, turbostratic boron nitride, or graphite.

4. The tooling fixture of claim 1, wherein the inner layer consists of the hexagonal boron nitride or graphite and the outer layer is the ceramic material.

5. The tooling fixture of claim 1, wherein the ceramic material comprises a polymer derived ceramic.

6. The tooling fixture of claim 1, wherein the one of the inner layer and the outer layer consists of hexagonal boron nitride.

7. The tooling fixture of claim 1, wherein the coating is disposed on the second surface.

8. The tooling fixture of claim 1, wherein the coating has a thickness ranging from 40 nm to 2000 nm.

9. The tooling fixture of claim 1, wherein each of the inner layer and the outer layer has a thickness ranging from 20 nm to 1000 nm.

* * * * *